United States Patent
Lee et al.

(10) Patent No.: US 11,772,115 B2
(45) Date of Patent: Oct. 3, 2023

(54) SUBSTRATE TREATING APPARATUS AND TREATMENT LIQUID DISPENSING METHOD FOR CONTROLLING A TEMPERATURE OF TREATMENT LIQUID

(71) Applicant: SEMES CO., LTD., Cheonan-si (KR)

(72) Inventors: Kang Suk Lee, Cheonan-si (KR); Joo Sung Lee, Cheonan-si (KR); Soon Kab Kwon, Gimhae-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 270 days.

(21) Appl. No.: 17/028,211

(22) Filed: Sep. 22, 2020

(65) Prior Publication Data
US 2021/0094055 A1 Apr. 1, 2021

(30) Foreign Application Priority Data
Sep. 26, 2019 (KR) .................. 10-2019-0118847

(51) Int. Cl.
*B05B 12/10* (2006.01)
*H01L 21/67* (2006.01)
(Continued)

(52) U.S. Cl.
CPC .............. *B05B 12/10* (2013.01); *B05B 12/12* (2013.01); *B08B 3/08* (2013.01);
(Continued)

(58) Field of Classification Search
None
See application file for complete search history.

(56) References Cited

U.S. PATENT DOCUMENTS

2007/0006483 A1* 1/2007 Kamikawa ........ H01L 21/67051
34/467
2011/0099838 A1* 5/2011 Hiroshiro ............. H05B 3/0052
34/201
(Continued)

FOREIGN PATENT DOCUMENTS

JP 2001-329387 A 11/2001
JP 2004-214449 A 7/2004
(Continued)

OTHER PUBLICATIONS

Korean Office Action dated Feb. 24, 2022 issued in corresponding Korean Application No. 10-2019-0118847.
(Continued)

*Primary Examiner* — Binu Thomas
(74) *Attorney, Agent, or Firm* — Harness, Dickey & Pierce, P.L.C.

(57) ABSTRACT

Disclosed is an apparatus for treating a substrate. The apparatus includes a substrate support unit that supports the substrate, a nozzle unit that dispenses a treatment liquid onto the substrate supported on the substrate support unit, and a liquid supply unit that supplies the treatment liquid to the nozzle unit. The liquid supply unit includes a main supply line that is connected to the nozzle unit and that supplies the treatment liquid to the nozzle unit, wherein the treatment liquid is prepared by mixing a chemical with DIW at a first temperature and DIW at a second temperature higher than the first temperature, and temperature of the treatment liquid is adjusted by regulating a flow rate of the DIW at the first temperature and a flow rate of the DIW at the second temperature without a separate heater.

12 Claims, 5 Drawing Sheets

(51) Int. Cl.
    *B05B 12/12*     (2006.01)
    *B08B 3/08*     (2006.01)
    *H01L 21/02*     (2006.01)

(52) U.S. Cl.
    CPC .... *H01L 21/02057* (2013.01); *H01L 21/6715* (2013.01); *H01L 21/67051* (2013.01); *H01L 21/67248* (2013.01); *H01L 21/67017* (2013.01)

(56) References Cited

U.S. PATENT DOCUMENTS

| | | | | |
|---|---|---|---|---|
| 2013/0302525 | A1* | 11/2013 | Tanaka | B05C 5/001 |
| | | | | 118/302 |
| 2016/0372341 | A1* | 12/2016 | Kobayashi | H01L 21/6715 |
| 2018/0061675 | A1* | 3/2018 | Kim | H01L 21/67051 |
| 2019/0027383 | A1* | 1/2019 | Nakai | H01L 21/67051 |
| 2020/0006101 | A1* | 1/2020 | Chen | H01L 21/67051 |

FOREIGN PATENT DOCUMENTS

| | | | |
|---|---|---|---|
| JP | 2011-211092 A | | 10/2011 |
| JP | 2015-167161 A | | 9/2015 |
| KR | 10-2006-0029372 A | | 4/2006 |
| KR | 1020060029372 A | * | 4/2006 |
| KR | 10-2009-0059286 A | | 6/2009 |
| KR | 10-2014-0089216 A | | 7/2014 |
| KR | 10-2016-0078581 A | | 7/2016 |
| KR | 10-2016-0150019 A | | 12/2016 |
| KR | 10-2018-0024060 A | | 3/2018 |
| KR | 10-2018-0099864 A | | 9/2018 |
| KR | 10-2020-0001481 A | | 1/2020 |

OTHER PUBLICATIONS

CA Office Action for Korean Application No. 10-2019-0118847 dated May 13, 2021.
Japanese Office Action dated Nov. 1, 2022 issued in corresponding Japanese Appln. No. 2020-159301.
Korean Notice of Allowance dated Jan. 2, 2023 issued in corresponding Korean Appln. No. 10-2019-0118847.

* cited by examiner

SUBSTRATE TREATING APPARATUS AND TREATMENT LIQUID DISPENSING METHOD FOR CONTROLLING A TEMPERATURE OF TREATMENT LIQUID

CROSS-REFERENCE TO RELATED APPLICATIONS

A claim for priority under 35 U.S.C. § 119 is made to Korean Patent Application No. 10-2019-0118847 filed on Sep. 26, 2019, in the Korean Intellectual Property Office, the entire contents of which are hereby incorporated by reference.

BACKGROUND

Embodiments of the inventive concept described herein relate to an apparatus for treating a substrate and a method for dispensing a treatment liquid.

In general, semiconductor elements are formed by performing various processes (e.g., a photo process, an etching process, an ion implantation process, a deposition process, and the like) on a substrate such as a silicon wafer.

Various treatment liquids may be used in the respective processes. For example, treatment liquids may be used in a process of coating a substrate with photo-resist in the photo process, or in a cleaning process for removing various types of contaminants adhering to the substrate before and after the processes.

SUMMARY

Embodiments of the inventive concept provide a substrate treating apparatus and a treatment liquid dispensing method for efficiently treating a substrate.

Furthermore, embodiments of the inventive concept provide a substrate treating apparatus and a treatment liquid dispensing method for controlling the temperature of a treatment liquid by adjusting the ratio of high-temperature DIW and room-temperature DIW without a separate heater.

Moreover, embodiments of the inventive concept provide a substrate treating apparatus and a treatment liquid dispensing method for improving temperature reliability even in the case of a temperature change by internal and external environments.

In addition, embodiments of the inventive concept provide a substrate treating apparatus and a treatment liquid dispensing method for increasing the uniformity of a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a substrate support unit that supports the substrate, a nozzle unit that dispenses a treatment liquid onto the substrate supported on the substrate support unit, and a liquid supply unit that supplies the treatment liquid to the nozzle unit. The liquid supply unit includes a main supply line that is connected to the nozzle unit and that supplies the treatment liquid to the nozzle unit, a first DIW supply line that is connected to the main supply line and that supplies DIW at a first temperature, a second DIW supply line that is connected to the main supply line and that supplies DIW at a second temperature higher than the first temperature, and a chemical supply line that is connected to the main supply line and that supplies a chemical. The apparatus further includes a control unit that adjusts temperature of the treatment liquid by regulating a flow rate of the DIW at the first temperature or the DIW at the second temperature.

In an embodiment, the main supply line may be provided with a thermometer that measures the temperature of the treatment liquid, and the control unit may regulate the flow rate of the DIW at the first temperature or the DIW at the second temperature, based on the temperature of the treatment liquid measured by the thermometer.

In an embodiment, the apparatus may further include a temperature detection member that measures temperature of the substrate supported on the substrate support unit, and the control unit may regulate the flow rate of the DIW at the first temperature or the DIW at the second temperature, based on the temperature of the substrate measured by the temperature detection member while the treatment liquid is dispensed.

In an embodiment, the flow rate of the DIW at the first temperature or the DIW at the second temperature may be differently provided depending on time.

In an embodiment, the temperature detection member may detect a place and time at which surface temperature of a first substrate being treated is detected to be relatively high, and in treatment of a second substrate, the control unit may regulate the flow rate of the DIW at the first temperature or the DIW at the second temperature to lower the temperature of the treatment liquid dispensed by the nozzle unit at the place and the time.

In an embodiment, the temperature of the treatment liquid may be lowered by increasing the flow rate of the DIW at the first temperature or decreasing the flow rate of the DIW at the second temperature.

In an embodiment, the temperature detection member may detect a place and time at which surface temperature of a first substrate being treated is detected to be relatively low, and in treatment of a second substrate, the control unit may regulate the flow rate of the DIW at the first temperature or the DIW at the second temperature to raise the temperature of the treatment liquid dispensed by the nozzle unit at the place and the time.

In an embodiment, the temperature of the treatment liquid may be raised by decreasing the flow rate of the DIW at the first temperature or increasing the flow rate of the DIW at the second temperature.

In an embodiment, the nozzle unit may dispense the treatment liquid while moving from a central region to an edge region of the substrate, and the control unit may increase the flow rate of the DIW at the second temperature when the nozzle is located in the edge region while the treatment liquid is dispensed.

In an embodiment, the nozzle unit may dispense the treatment liquid while moving from a central region to an edge region of the substrate, and the control unit may increase the flow rate of the DIW at the first temperature when the nozzle is located in the central region while the treatment liquid is dispensed.

According to an exemplary embodiment, a method for dispensing a treatment liquid onto a substrate is provided. The treatment liquid is prepared by mixing a chemical with DIW at a first temperature and DIW at a second temperature higher than the first temperature, and temperature of the treatment liquid is adjusted by regulating a flow rate of the DIW at the first temperature and a flow rate of the DIW at the second temperature.

In an embodiment, the flow rate of the DIW at the first temperature or the DIW at the second temperature may be regulated based on surface temperature of the substrate measured while the treatment liquid is dispensed.

In an embodiment, the flow rate of the DIW at the first temperature or the DIW at the second temperature may be regulated based on temperature of the substrate measured while the treatment liquid is dispensed.

In an embodiment, the flow rate of the DIW at the first temperature or the DIW at the second temperature may be differently provided depending on time.

In an embodiment, a place and time at which surface temperature of a first substrate being treated is detected to be relatively high may be detected, and in treatment of a second substrate, the flow rate of the DIW at the first temperature or the DIW at the second temperature may be regulated to lower the temperature of the treatment liquid dispensed at the place and the time.

In an embodiment, the temperature of the treatment liquid may be lowered by increasing the flow rate of the DIW at the first temperature or decreasing the flow rate of the DIW at the second temperature.

In an embodiment, a place and time at which surface temperature of a first substrate being treated is detected to be relatively low may be detected, and in treatment of a second substrate, the flow rate of the DIW at the first temperature or the DIW at the second temperature may be regulated to raise the temperature of the treatment liquid dispensed at the place and the time.

In an embodiment, the temperature of the treatment liquid may be raised by decreasing the flow rate of the DIW at the first temperature or increasing the flow rate of the DIW at the second temperature.

In an embodiment, a nozzle unit may dispense the treatment liquid while moving from a central region to an edge region of the substrate, and the flow rate of the DIW at the second temperature may be increased when the nozzle unit dispenses the treatment liquid in the edge region.

In an embodiment, a nozzle unit may dispense the treatment liquid while moving from a central region to an edge region of the substrate, and the flow rate of the DIW at the first temperature may be increased when the nozzle unit dispenses the treatment liquid in the central region.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

In the entire specification, the terminology, component "~unit" or "~module," refers to a software component or a hardware component such as an FPGA or an ASIC, and performs at least one function or operation. It should be, however, understood that the component "~unit" or "~module" is not limited to a software or hardware component. The component "~unit" or "~module" may be implemented in storage media that can be designated by addresses. The component "~unit" or "~module" may also be configured to regenerate one or more processors.

For example, the component "~unit" or "~module" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "~unit" or "~module" may be separately performed by a plurality of components and components "~units" or "~modules" and may also be integrated with other additional components.

Figure 1:
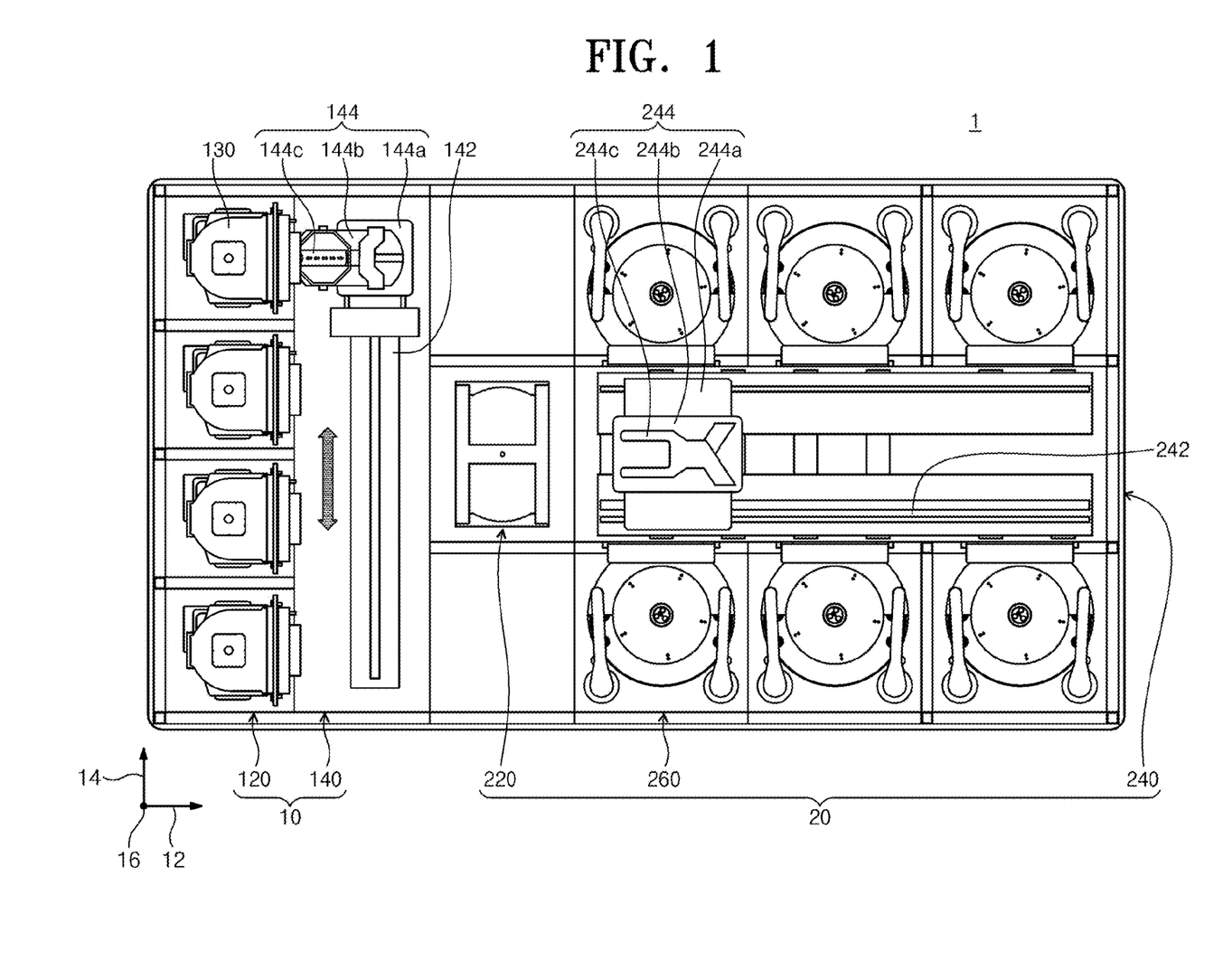
FIG. 1 is a plan view illustrating substrate treating equipment according to an embodiment of the inventive concept.

FIG. 1 is a plan view illustrating substrate treating equipment according to an embodiment of the inventive concept.

Referring to FIG. 1, the substrate treating equipment 1 includes an index module 100 and a process module 200. The index module 100 includes a load port 120 and a transfer frame 140. The load port 120, the transfer frame 140, and the process module 200 are sequentially arranged in a row. Hereinafter, a direction in which the load port 120, the transfer frame 140, and the process module 200 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier 130 having substrates W received therein is seated on the load port 120. A plurality of load ports 120 may be provided. The load ports 120 may be disposed in a row along the second direction 14. FIG. 1 illustrates an example that the index module 100 includes four load ports 120. However, the number of load ports 120 may be increased or decreased depending on conditions such as process efficiency and footprint of the process module 200. Slots (not illustrated) that support the edges of the substrates W are formed in the carrier 130. The slots are provided in the third direction 16. The substrates W are stacked in the carrier 130 in a state of being spaced apart from each other along the third direction 16. A front opening unified pod (FOUP) may be used as the carrier 130.

The process module 200 includes a buffer unit 220, a transfer chamber 240, and process chambers 260. The transfer chamber 240 is disposed such that the lengthwise direction thereof is parallel to the first direction 12. The process chambers 260 are disposed on one side and an opposite side of the transfer chamber 240 along the second direction 14. The process chambers 260 on the one side of the transfer chamber 240 and the process chambers 260 on the opposite side of the transfer chamber 240 are located in a symmetric arrangement with respect to the transfer chamber 240. Some of the process chambers 260 are disposed along the lengthwise direction of the transfer chamber 240. Furthermore, the other process chambers 260 are stacked one above another. That is, the process chambers 260 may be disposed in an A×B array (A and B being natural numbers of 1 or larger) on the one side of the transfer chamber 240. Here, "A" is the number of process chambers 260 provided in a row along the first direction 12, and "B" is the number of process chambers 260 provided in a column along the third direction 16. In a case where four or six process chambers 260 are disposed on the one side of the transfer chamber 240, the process chambers 26 may be arranged in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the one side and the opposite side of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) therein, in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 includes a base 144*a*, a body 144*b*, and an index arm 144*c*. The base 144*a* is movable along the index rail 142. The body 144*b* is coupled to the base 144*a*. The body 144*b* is movable on the base 144*a* along the third direction 16. Furthermore, the body 144*b* is rotatable on the base 144*a*. The index arm 144*c* is coupled to the body 144*b* and is movable forward and backward relative to the body 144*b*. A plurality of index arms 144*c* may be provided. The index arms 144*c* may be individually driven. The index arms 144*c* may be stacked one above another with a spacing gap therebetween along the third direction 16. Some of the index arms 144*c* may be used to transfer the substrates W from the process module 200 to the carriers 130, and the other index arms 144*c* may be used to transfer the substrates W from the carriers 130 to the process module 200. Accordingly, particles generated from the substrates W that are to be treated may be prevented from adhering to the treated substrates W in the process in which the index robot 144 transfers the substrates W between the carriers 130 and the process module 200.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 includes a base 244*a*, a body 244*b*, and a main arm 244*c*. The base 244*a* is movable along the guide rail 242. The body 244*b* is coupled to the base 244*a*. The body 244*b* is movable on the base 244*a* along the third direction 16. Furthermore, the body 244*b* is rotatable on the base 244*a*. The main arm 244*c* is coupled to the body 244*b* and is movable forward and backward relative to the body 244*b*. A plurality of main arms 244*c* may be provided. The main arms 244*c* may be individually driven. The main arms 244*c* may be stacked one above another with a spacing gap therebetween along the third direction 16. The main arms 244*c* used to transfer the substrates W from the buffer unit 220 to the process chambers 260 may differ from the main arms 244*c* used to transfer the substrates W from the process chambers 260 to the buffer unit 220.

Each of the process chambers 260 has a substrate treating apparatus 300 therein, in which a cleaning process is performed on a substrate W. The substrate treating apparatuses 300 in the respective process chambers 260 may have different structures depending on the types of cleaning processes performed by the substrate treating apparatuses 300. Selectively, the substrate treating apparatuses 300 in the respective process chambers 260 may have the same structure. Selectively, the process chambers 260 may be divided into a plurality of groups. The substrate treating apparatuses 300 in the process chambers 260 belonging to the same group may have the same structure, and the substrate treating apparatuses 300 in the process chambers 260 belonging to different groups may have different structures. For example, in a case where the process chambers 260 are divided into two groups, a first group of process chambers 260 may be disposed on the one side of the transfer chamber 240, and a second group of process chambers 260 may be disposed on the opposite side of the transfer chamber 240. Selectively, on the one side and the opposite side of the transfer chamber 240, the first group of process chambers 260 may be provided in a lower layer, and the second group of process chambers 260 may be provided in an upper layer. The first group of process chambers 260 may be distinguished from the second group of process chambers 260 depending on the types of chemicals used or the types of cleaning methods.

Figure 2:
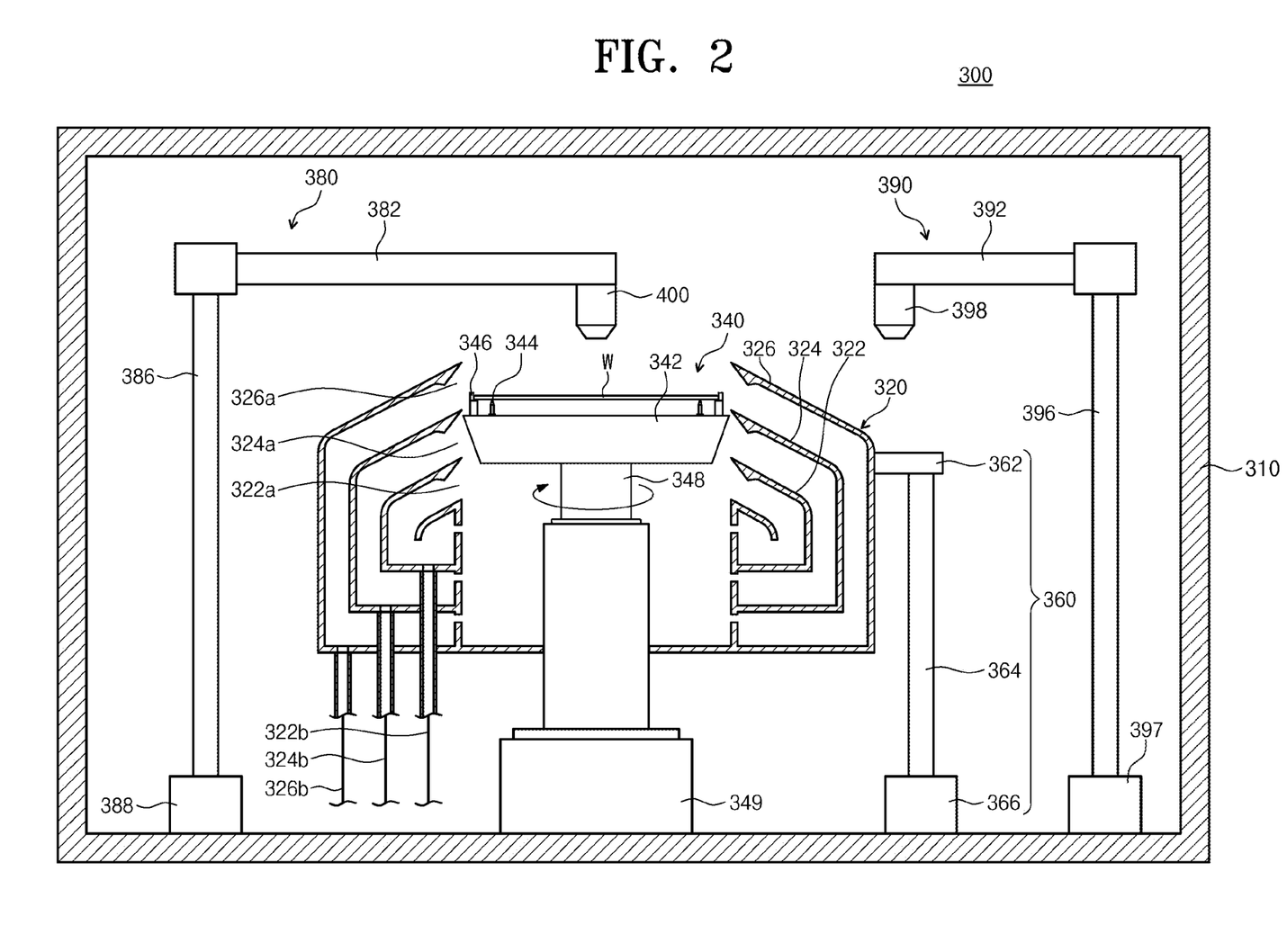
FIG. 2 is a view illustrating a substrate treating apparatus according to an embodiment of the inventive concept.

FIG. 2 is a view illustrating a substrate treating apparatus according to an embodiment of the inventive concept.

Referring to FIG. 2, the substrate treating apparatus 300 may include a chamber 310, a cup 320, a support unit 340, a lifting unit 360, and a nozzle unit 380. The substrate treating apparatus 300 may further include an auxiliary nozzle unit 390.

The chamber 310 has a space therein. The cup 320 is located in the space of the chamber 310. The cup 320 has a space in which a substrate treating process is performed. The cup 320 is open at the top thereof. The cup 320 includes an inner bowl 322, an intermediate bowl 324, and an outer bowl 326. The bowls 322, 324, and 326 recover different treatment fluids used in the substrate treating process. The inner bowl 322 has an annular ring shape surrounding the support unit 340, the intermediate bowl 324 has an annular ring shape surrounding the inner bowl 322, and the outer bowl 326 has an annular ring shape surrounding the intermediate bowl 324. An interior space 322*a* of the inner bowl 322, a space 324*a* between the inner bowl 322 and the intermediate bowl 324, and a space 326*a* between the intermediate bowl 324 and the outer bowl 326 function as inlets through which the treatment fluids are introduced into the inner bowl 322, the intermediate bowl 324, and the outer bowl 326. The bowls 322, 324, and 326 have recovery lines 322*b*, 324*b*, and 326*b* connected thereto, respectively. The recovery lines 322*b*, 324*b*, and 326*b* vertically extend downward from the bottoms of the bowls 322, 324, and 326. The recovery lines 322b, 324b, and 326b release the treatment fluids introduced into the bowls 322, 324, and 326, respectively. The released treatment fluids may be reused through an external treatment fluid regeneration system (not illustrated).

The support unit 340 is disposed in the treatment space of the cup 320. The support unit 340 supports and rotates a substrate W during the substrate treating process. The support unit 340 includes a spin chuck 342, support pins 344, chuck pins 346, a drive shaft 348, and an actuator 349. The spin chuck 342 has an upper surface with a substantially circular shape when viewed from above. The drive shaft 348, which is rotatable by the actuator 349, is fixedly coupled to a bottom surface of the spin chuck 342. When the drive shaft 348 rotates, the spin chuck 342 is rotated. To support the substrate W, the support unit 340 includes the support pins 344 and the chuck pins 346. The support pins 344 are disposed on an edge portion of the upper surface of the spin chuck 342 so as to be spaced apart from each other at predetermined intervals. The support pins 344 protrude upward from the spin chuck 342. The support pins 344 are arranged to form an annular ring shape as a whole by a combination thereof. The support pins 344 support the edge of the bottom surface of the substrate W such that the substrate W is spaced apart from the upper surface of the spin chuck 342 by a predetermined distance. The chuck pins 346 are disposed farther away from the center of the spin chuck 342 than the support pins 344. The chuck pins 346 protrude upward from the spin chuck 342. The chuck pins 346 support the side of the substrate W to prevent the substrate W from deviating from a correct position to a side when the support unit 340 is rotated. The chuck pins 346 are rectilinearly movable between a standby position and a support position along the radial direction of the spin chuck 342. The standby position is a position farther away from the center of the spin chuck 342 than the support position. The chuck pins 346 are located in the standby position when the substrate W is loaded onto or unloaded from the support unit 340. The chuck pins 346 are located in the support position when the substrate treating process is performed on the substrate W. In the support position, the chuck pins 346 are brought into contact with the side of the substrate W.

The lifting unit 360 rectilinearly moves the cup 320 in the vertical direction. The lifting unit 360 may move the plurality of bowls 322, 324 and 326 of the cup 320. Alternatively, the lifting unit 360 may individually move the bowls 322, 324, and 326 although not illustrated. As the cup 320 is vertically moved, the height of the cup 320 relative to the support unit 340 is changed. The lifting unit 360 includes a bracket 362, a movable shaft 364, and an actuator 366. The bracket 362 is fixedly attached to an outer wall of the cup 320, and the movable shaft 364 is fixedly coupled to the bracket 362 and is vertically moved by the actuator 366. The cup 320 is lowered such that the support unit 340 protrudes above the cup 320 when the substrate W is placed on the support unit 340 or raised off the support unit 340. Furthermore, when the substrate treating process is performed, the height of the cup 320 is adjusted depending on the types of the treatment fluids dispensed onto the substrate W, such that the treatment fluids are introduced into the preset bowls 322, 324, and 326. For example, while the substrate W is treated with a first treatment fluid, the substrate W is located at the height corresponding to the interior space 322a of the inner bowl 322. Furthermore, while the substrate W is treated with a second treatment fluid, the substrate W may be located at the height corresponding to the space 324a between the inner bowl 322 and the intermediate bowl 324, and while the substrate W is treated with a third treatment fluid, the substrate W may be located at the height corresponding to the space 326a between the intermediate bowl 324 and the outer bowl 326. Alternatively, the lifting unit 360 may vertically move the support unit 340 instead of the cup 320. In another case, the cup 320 may have a single bowl 322.

The nozzle unit 380 dispenses a first treatment liquid onto the substrate W. For example, the first treatment liquid may be a cleaning solution, a developing solution, or a photosensitive liquid according to a process. One or more nozzle units 380 may be provided. The nozzle unit 380 includes a nozzle support rod 382, a support rod 386, an actuator 388, and a nozzle 400. The support rod 386 is provided such that the lengthwise direction thereof is parallel to the third direction 16, and the actuator 388 is coupled to a lower end of the support rod 386. The actuator 388 rotates, raises, and lowers the support rod 386. The nozzle support rod 382 is coupled perpendicular to an upper end of the support rod 386 that is opposite to the lower end of the support rod 386 to which the actuator 388 is coupled. The nozzle 400 is mounted on a bottom surface of a distal end of the nozzle support rod 382. The nozzle 400 is moved between a process position and a standby position by the actuator 388. The process position is a position where the nozzle 400 is located directly above the cup 320, and the standby position is a position where the nozzle 400 deviates from directly above the cup 320.

The auxiliary nozzle unit 390 dispenses a second treatment liquid onto the substrate W. According to an embodiment, the second treatment liquid may be of a different type than the first treatment liquid. The auxiliary nozzle unit 390 may be rotatable. The auxiliary nozzle unit 390 includes an auxiliary nozzle support rod 392, an auxiliary support rod 396, an auxiliary actuator 397, and an auxiliary nozzle 398. The auxiliary support rod 396 is provided such that the lengthwise direction thereof is parallel to the third direction 16, and the auxiliary actuator 397 is coupled to a lower end of the auxiliary support rod 396. The auxiliary actuator 397 moves the auxiliary support rod 396. For example, the auxiliary actuator 397 may rotate the auxiliary support rod 396. Furthermore, the auxiliary actuator 397 may raise and lower the auxiliary support rod 396. The auxiliary nozzle support rod 392 is coupled to an upper portion of the auxiliary support rod 396. The auxiliary nozzle 398 is mounted on a bottom surface of a distal end of the auxiliary nozzle support rod 392. The auxiliary nozzle 398 is moved between a process position and a standby position by the auxiliary actuator 397. The process position is a position where the auxiliary nozzle 398 is located directly above the cup 320, and the standby position is a position where the auxiliary nozzle 398 deviates from directly above the cup 320.

Figure 3:
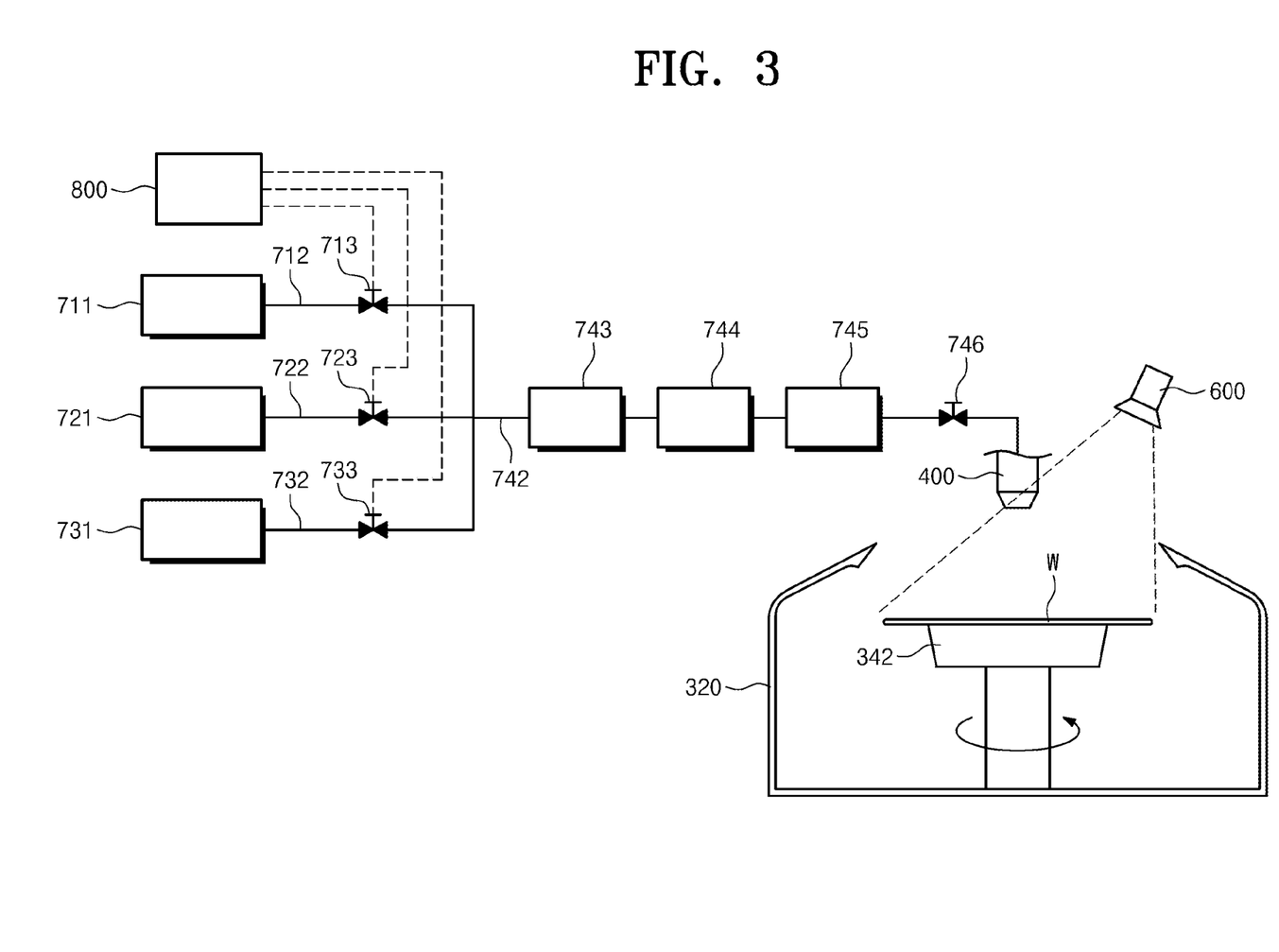
FIG. 3 is a view illustrating a liquid supply unit of FIG. 2.

FIG. 3 is a view illustrating a liquid supply unit 700 of FIG. 2. Referring to FIG. 3, the liquid supply unit 700 includes a main supply line 742, a first DIW supply line 712, a second DIW supply line 722, and a chemical supply line 732.

The first DIW supply line 712 is connected to a first storage tank 711 in which room-temperature DIW is stored. The second DIW supply line 722 is connected to a second storage tank 721 in which DIW, the temperature of which is higher than the room temperature, is stored. The chemical supply line 732 is connected to a chemical storage tank 731 in which a chemical is stored.

The first DIW supply line 712 is provided with a first valve 713 that regulates the flow rate of the room-temperature DIW supplied. The second DIW supply line 722 is provided with a second valve 723 that regulates the flow rate of the high-temperature DIW supplied. The chemical supply line 732 is provided with a third valve 733 that regulates the flow rate of the chemical supplied.

A control unit 800 controls the first valve 713, the second valve 723, and the third valve 733 to regulate the flow rates of the room-temperature DIW, the high-temperature DIW, and the chemical.

The main supply line 742 is provided with a flow meter 743, a thermometer 744, and a density meter 745. Furthermore, the main supply line 742 is provided with a fourth valve 746 that regulates the flow rate of a treatment liquid prepared by mixing the room-temperature DIW, the high-temperature DIW, and the chemical. The nozzle 400 is connected to an end portion of the main supply line 742.

The first DIW supply line 712, the second DIW supply line 722, and the chemical supply line 732 are connected by the main supply line 742.

The control unit 800 adjusts the temperature of the treatment liquid by controlling the first valve 713 that regulates the flow rate of the room-temperature DIW and the second valve 723 that regulates the flow rate of the high-temperature DIW.

The control unit 800 performs feedback control on the degrees to which the first valve 713 and the second valve 723 are open, based on a temperature measured by the thermometer 744. That is, the control unit 800 regulates the flow rate of the room-temperature DIW or the high-temperature DIW, based on the temperature of the treatment liquid measured by the thermometer 744.

The substrate treating apparatus 300 further includes a temperature detection member 600 that measures the temperature of the substrate W supported on the support unit 340. The temperature detection member 600 is capable of measuring the temperature of the substrate W by region.

Figure 4:
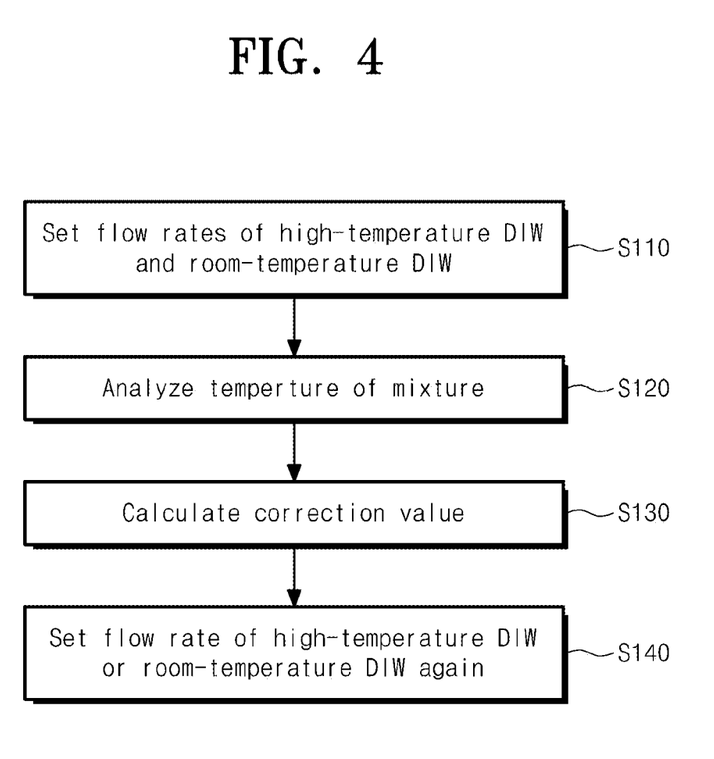
FIG. 4 is a flowchart illustrating a treatment liquid dispensing method according to an embodiment of the inventive concept.

FIG. 4 is a flowchart illustrating a treatment liquid dispensing method according to an embodiment of the inventive concept. Referring to FIG. 4, first, the flow rate of the high-temperature DIW and the flow rate of the room-temperature DIW are set (S110). Next, the temperature of a mixture of the high-temperature DIW, the room-temperature DIW, and the chemical is analyzed (S120). When the mixture has a low temperature, the temperature of the mixture is raised by increasing the flow rate of the high-temperature DIW or decreasing the flow rate of the room-temperature DIW depending on a correction equation. In contrast, when the mixture has a high temperature, the temperature of the mixture is lowered by decreasing the flow rate of the high-temperature DIW or increasing the flow rate of the room-temperature DIW depending on the correction equation (S140).

Figure 5:
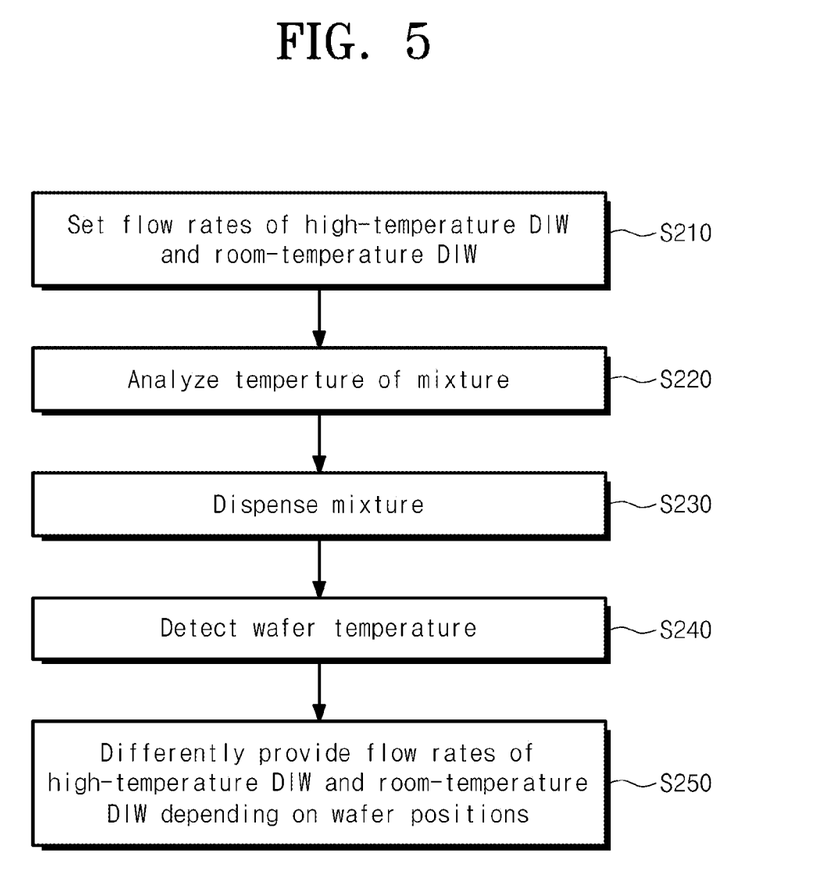
FIG. 5 is a flowchart illustrating a treatment liquid dispensing method according to another embodiment of the inventive concept.

FIG. 5 is a flowchart illustrating a treatment liquid dispensing method according to another embodiment of the inventive concept. Referring to FIG. 5, first, the flow rate of the high-temperature DIW and the flow rate of the room-temperature DIW are set (S210). Next, the temperature of a mixture of the high-temperature DIW, the room-temperature DIW, and the chemical is analyzed (S220). When the mixture has a low temperature, the temperature of the mixture is raised by increasing the flow rate of the high-temperature DIW or decreasing the flow rate of the room-temperature DIW depending on a correction equation. In contrast, when the mixture has a high temperature, the temperature of the mixture is lowered by decreasing the flow rate of the high-temperature DIW or increasing the flow rate of the room-temperature DIW depending on the correction equation (not illustrated).

The temperature detection member 600 detects the place and the time at which the surface temperature of a first substrate being treated is detected to be relatively high (S240). In treatment of a second substrate after the first substrate is completely treated, the flow rate of the room-temperature DIW or the high-temperature DIW is regulated based on the detection result detected when the first substrate is treated, such that the temperature of a treatment liquid dispensed onto the second substrate is lowered at the place and the time at which the surface temperature of the first substrate has been detected to be relatively high. Accordingly, the flow rates of the room-temperature DIW and the high-temperature DIW may be differently provided depending on time and positions on the substrate (S250). The temperature of the treatment liquid may be lowered by increasing the flow rate of the room-temperature DIW or decreasing the flow rate of the high-temperature DIW.

The temperature detection member 600 detects the place and the time at which the surface temperature of a first substrate being treated is detected to be relatively low (S240). In treatment of a second substrate after the first substrate is completely treated, the flow rate of the room-temperature DIW or the high-temperature DIW is regulated based on the detection result detected when the first substrate is treated, such that the temperature of a treatment liquid dispensed onto the second substrate is raised at the place and the time at which the surface temperature of the first substrate has been detected to be relatively low. Accordingly, the flow rates of the room-temperature DIW and the high-temperature DIW may be differently provided depending on time and positions on the substrate. The temperature of the treatment liquid may be raised by decreasing the flow rate of the room-temperature DIW or increasing the flow rate of the high-temperature DIW.

The temperature detection member 600 detects the place and the time at which the surface temperature of the second substrate being treated is detected to be relatively low (S240). In treatment of a third substrate after the second substrate is completely treated, the flow rate of the room-temperature DIW or the high-temperature DIW is regulated based on the detection result detected when the second substrate is treated, such that the temperature of a treatment liquid dispensed onto the third substrate is raised at the place and the time at which the surface temperature of the second substrate has been detected to be relatively low. Accordingly, the flow rates of the room-temperature DIW and the high-temperature DIW may be differently provided depending on time and positions on the substrate. The temperature of the treatment liquid may be raised by decreasing the flow rate of the room-temperature DIW or increasing the flow rate of the high-temperature DIW.

The substrate treating apparatus 300 may obtain a dispensing trend of density and temperature as big data and may treat a substrate based on the big data.

Above the substrate, the nozzle 400 may dispense the treatment liquid onto the substrate while moving from a central region to a peripheral region. The control unit 800 increases the flow rate of the high-temperature DIW when the nozzle 400 is located above the edge region of the substrate while the treatment liquid is dispensed. Furthermore, the control unit 800 increases the flow rate of the room-temperature DIW when the nozzle 400 is located above the central region of the substrate while the treatment liquid is dispensed.

According to the inventive concept, the temperature of the treatment liquid dispensed may be controlled by adjusting the ratio of the high-temperature DIW and the room-temperature DIW without a separate heater.

Furthermore, according to the inventive concept, the thermometer is provided at the supply end, and the temperature of the supply end is always detected even in the case of a temperature change by an environment. Accordingly, temperature reliability may be improved by performing feedback control on the flow rates of the room-temperature DIW and the high-temperature DIW.

In addition, according to the inventive concept, the temperature and density of the chemical may be adjustable depending on positions on a substrate. Thus, the uniformity of the substrate may be increased.

As described above, according to the embodiments of the inventive concept, the temperature of the treatment liquid dispensed may be controlled by adjusting the ratio of the high-temperature DIW and the room-temperature DIW without a separate heater.

Furthermore, according to the embodiments of the inventive concept, temperature reliability may be improved even in the case of a temperature change by an environment.

In addition, according to the embodiments of the inventive concept, the uniformity of a substrate may be increased.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a substrate support unit configured to support the substrate;
   a nozzle unit configured to dispense a treatment liquid onto the substrate supported on the substrate support unit; and
   a liquid supply unit configured to supply the treatment liquid to the nozzle unit,
   wherein the treatment liquid is a mix of deionized water at a first temperature, deionized water at a second temperature, and a chemical,
   wherein the liquid supply unit includes:
   a main supply line connected to the nozzle unit and configured to supply the treatment liquid to the nozzle unit;
   a first DIW supply line having a first end connected to the main supply line and a second end connected to a first storage tank, the first storage tank storing deionized water at the first temperature, the first DIW supply line configured to supply DIW at the first temperature;
   a second DIW supply line having a first end connected to the main supply line and a second end connected to a second storage tank, the second storage tank storing deionized water at the second temperature, greater than the first temperature, the second DIW supply line configured to supply DIW at the second temperature;
   a temperature detection member configured to measure temperature of the substrate supported on the substrate support unit, and
   a chemical supply line connected to the main supply line and configured to supply a chemical, and
   wherein a temperature of the treatment liquid dispensed is controlled by adjusting a ratio of the DIW at the first temperature and the DIW at the second temperature by a control unit configured to
   perform a feedback control on a flow rate of the DIW at the first temperature and the DIW at the second temperature,
   adjust the temperature of the treatment liquid by regulating a flow rate of the DIW at the first temperature of the DIW at the second temperature, and
   regulate the flow of the DIW at the first temperature or the DIW at the second temperature, based on the temperature of the substrate measured by the temperature detection member while the treatment liquid is dispensed.

2. The apparatus of claim 1, wherein the main supply line is provided with a thermometer configured to measure the temperature of the treatment liquid, and
   wherein the control unit configured to regulate the flow rate of the DIW at the first temperature or the DIW at the second temperature, based on the temperature of the treatment liquid measured by the thermometer.

3. The apparatus of claim 1, wherein the control unit is configured to operate flow rate of the DIW at the first temperature or the DIW at the second temperature is differently provided depending on time.

4. The apparatus of claim 1, wherein in response to the temperature detection member detecting a place and time at which surface temperature of a first substrate being treated is detected to be higher than a first point, the control unit is configured to regulate the flow rate of the DIW at the first temperature or the DIW at the second temperature to lower the temperature of the treatment liquid dispensed by the nozzle unit at the place and the time.

5. The apparatus of claim 4, wherein the control unit is configured to lower the temperature of the treatment liquid by increasing the flow rate of the DIW at the first temperature or decreasing the flow rate of the DIW at the second temperature.

6. The apparatus of claim 3, wherein the temperature detection member detects a place and time at which surface temperature of a first substrate being treated is detected to be lower than a second point, and in treatment of a second substrate, the control unit regulates the flow rate of the DIW at the first temperature or the DIW at the second temperature to raise the temperature of the treatment liquid dispensed by the nozzle unit at the place and the time.

7. The apparatus of claim 6, wherein the control unit is configured to raise the temperature of the treatment liquid by decreasing the flow rate of the DIW at the first temperature or increasing the flow rate of the DIW at the second temperature.

8. The apparatus of claim 1, wherein the nozzle unit is configured to dispense the treatment liquid while moving from a central region to an edge region of the substrate, and
wherein the control unit is configured to increase the flow rate of the DIW at the second temperature when the nozzle unit is located in the edge region while the treatment liquid is dispensed.

9. The apparatus of claim 1, wherein the nozzle unit is configured to dispense the treatment liquid while moving from a central region to an edge region of the substrate, and
wherein the control unit is configured to increase the flow rate of the DIW at the first temperature when the nozzle unit is located in the central region while the treatment liquid is dispensed.

10. An apparatus for treating a substrate, the apparatus comprising:
a substrate support unit configured to support the substrate;
a temperature detection member configured to measure temperature of the substrate supported on the substrate support unit,
a nozzle unit configured to dispense a treatment liquid onto the substrate supported on the substrate support unit; and
a liquid supply unit configured to supply the treatment liquid to the nozzle unit,
wherein the treatment liquid is a mix of deionized water at a first temperature, deionized water at a second temperature, and a chemical,
wherein the liquid supply unit includes:
a main supply line connected to the nozzle unit and configured to supply the treatment liquid to the nozzle unit, the main supply line being provided with a thermometer configured to measure temperature of the treatment liquid;
a first DIW supply line having a first end connected to the main supply line and a second end connected to a first storage tank, the first storage tank storing deionized water at a first temperature, the first DIW supply line configured to supply DIW at a first temperature;
a second DIW supply line having a first end connected to the main supply line and a second end connected to a second storage tank, the second storage tank storing deionized water at a second temperature, greater than the first temperature, the second DIW supply line configured to supply DIW at the second temperature; and
a chemical supply line connected to the main supply line and configured to supply a chemical,
wherein the temperature of the treatment liquid is controlled by adjusting a ratio of the DIW at the first temperature and the DIW at the second temperature by a control unit configured to
perform a feedback control on a flow rate of the DIW at the first temperature and the DIW at the second temperature,
adjust the temperature of the treatment liquid by regulating a flow rate of the DIW at the first temperature or the DIW at the second temperature,
regulate the flow rate of the DIW at the first temperature or the DIW at the second temperature, based on the temperature of the treatment liquid measured by the thermometer; and
regulate the flow rate of the DIW at the first temperature or the DIW at the second temperature, based on the temperature of the substrate measured by the temperature detection member while the treatment liquid is dispensed.

11. The apparatus of claim 1, wherein the first temperature is room temperature, and the second temperature is greater than room temperature.

12. The apparatus of claim 10, wherein the first temperature is room temperature, and the second temperature is greater than room temperature.

* * * * *